United States Patent [19]
Shimizu

[11] Patent Number: 4,504,730
[45] Date of Patent: Mar. 12, 1985

[54] METHOD FOR HEATING SEMICONDUCTOR WAFER BY MEANS OF APPLICATION OF RADIATED LIGHT

[75] Inventor: Hiroshi Shimizu, Yokohama, Japan

[73] Assignee: Ushio Denki Kabushiki Kaisha, Tokyo, Japan

[21] Appl. No.: 538,935

[22] Filed: Oct. 4, 1983

[51] Int. Cl.³ .................. H01L 21/324; F27D 11/02
[52] U.S. Cl. .................................. 219/411; 219/405; 118/725
[58] Field of Search ............ 219/405, 411, 354; 118/724, 725, 50.1, 728

[56] References Cited

U.S. PATENT DOCUMENTS

| | | | |
|---|---|---|---|
| 3,471,326 | 10/1969 | Kappelmeyer | 118/725 |
| 3,539,759 | 11/1970 | Spiro | 118/725 |
| 3,836,751 | 9/1974 | Anderson | 219/405 |
| 4,101,759 | 7/1978 | Anthony | 219/411 |
| 4,113,547 | 9/1978 | Katz | 118/725 |
| 4,339,645 | 7/1982 | Miller | 118/50.1 |

Primary Examiner—Roy N. Envall, Jr.
Assistant Examiner—Teresa J. Walberg
Attorney, Agent, or Firm—Ziems, Walter & Shannon

[57] ABSTRACT

Disclosed herein is a heating method of a semiconductor wafer by means of application of radiated light. The wafer is additionally heated by subsidiary heating device which per se is heated upon exposure to the radiated light and is arranged in contact with the surface of the circumferential edge or a surface portion lying in the vicinity of the circumferential edge of the semiconductor wafer. The ratio of the characteristic value ($\alpha$) of the subsidiary heating device to that ($\beta$) of the wafer is limited to 0.7 to 1.3, said $\alpha$ and $\beta$ being expressed respectively by the following formulae:

$$\alpha = \frac{1 - \eta_1}{\rho_1 \cdot d_1 \cdot C_1}$$

$$\beta = \frac{1 - \eta_2}{\rho_2 \cdot d_2 \cdot C_2}$$

where $\eta_1$, $\eta_2$ are reflectivities, $\rho_1$, $\rho_2$ are specific gravities (g/cm³), $d_1$, $d_2$ are thicknesses (cm) and $C_1$, $C_2$ are specific heats (joule/g.°C.) of the subsidiary heating device and semiconductor wafer, respectively. The above heating method is effective in preventing the occurrence of "warping" and "slip line".

4 Claims, 3 Drawing Figures

METHOD FOR HEATING SEMICONDUCTOR WAFER BY MEANS OF APPLICATION OF RADIATED LIGHT

BACKGROUND OF THE INVENTION (1) Field of the Invention

This invention relates to a method for heating a semiconductor wafer by means of application of radiated light.

(2) Description of the Prior Art

The ion implantation process has recently been finding actual utility as an effective method for introducing dopant atoms into a semiconductor wafer (hereinafter may be called "wafer" for the sake of brevity) since it is possible to control accurately the concentration levels of dopant atoms and the depths of resulting junctions. In the ion implantation process, the dopant atoms are ionized and accelerated to high velocity and the wafer is bombarded with the dopant atoms. Whenever the ion implantation process is carried out, it is necessary to subject each resulting wafer to a subsequent heating treatment at about 1000° C. or higher so that any crystal defects which have been developed due to changes in crystalline state at the surface of the wafer can be healed to ensure desired surface conditions. This heat treatment must be carried out in a short time period so as to prevent concentration distribution of the implanted dopant atoms in the depthwise direction of the wafer from changing due to thermal diffusion. Furthermore, there is an outstanding demand for the establishment of a high-speed heating and cooling cycle for wafers in order to improve their productivity.

Reflecting the above-mentioned demands, a novel method has recently been developed to heat wafers by means of application of radiated light. According to this method, the temperatures of wafers may be raised to 1000° C.–1400° C. in a time period as short as a few seconds.

It has however been found that, when a wafer, for example, a wafer of a single crystal of silicon is heated to a treatment temperature of about 1000° C. or so in a short time period of not longer than a few seconds and is then held at that treatment temperature by means of mere application of radiated light so as to carry out its heat treatment, a relatively large temperature difference occurs between the circumferential portion of the wafer and its central portion in the course of the heat-raising and heat treatment step, thereby developing such large "warping" as to impair subsequent treatment and/or processing steps and also a damage called "slip line" in the wafer.

The thickness of a wafer is generally very small, namely, of a level of about 0.5 mm or so and its thicknesswise temperature distribution is thus rendered substantially uniform in a very short time period of a level of $10^{-3}$ second or so. Accordingly, a wafer is not practically affected adversely by any thicknesswise non-uniform temperature distribution. The above-mentioned "warping" or "slip line" is hence caused by the non-uniform temperature distribution in the direction extending along the surfaces of the wafer. Namely, the temperature of the wafer is kept considerably lower at its circumferential portion compared with its central portion, because even if the surfaces of the wafer are heated with a uniform radiant energy density by means of application of radiated light, far more heat is allowed to radiate off from the circumferential portion of the wafer than its central portion and the temperature of the circumferential portion of the wafer cannot thus follow that of the central portion of the wafer when the temperature of the wafer is raised, and the former temperature cannot reach the latter temperature even during the heat treatment of the wafer.

If a wafer develops such large "warping", some problems will be encountered in its subsequent treatment and/or processing steps, including for example that a pattern image may be distorted in the photoetching treatment step. On the other hand, the occurrence of "slip line" makes it impossible to use the wafer as a semiconductor material, in other words, destroys its value and, accordingly, leads to a fatal loss.

SUMMARY OF THE INVENTION

With the foregoing in view, the present invention has as its object the provision of a heating method of a semiconductor wafer by means of application of radiated light without developing such large "warping" as impairing subsequent treatment and/or processing steps of the semiconductor wafer or such a damage as "slip line".

In one aspect of this invention, there is thus provided a method for heating a semiconductor wafer by means of application of light radiated from a light source while additionally heating a circumferential portion of the semiconductor wafer by subsidiary heating means which per se is heated upon exposure to the radiated light and is arranged in contact with the surface of a circumferential edge or a surface portion lying in the vicinity of the circumferential edge of the semiconductor wafer, which method comprises limiting the ratio ($\alpha/\beta$) of the characteristic value ($\alpha$) of the subsidiary heating means to that ($\beta$) of the semiconductor wafer to from 0.7 to 1.3, said $\alpha$ and $\beta$ being expressed respectively by the following formulae:

$$\alpha = \frac{1 - \eta_1}{\rho_1 \cdot d_1 \cdot C_1}$$

$$\beta = \frac{1 - \eta_2}{\rho_2 \cdot d_2 \cdot C_2}$$

where $\eta_1$, $\eta_2$: reflectivities of the subsidiary heating means and semiconductor wafer, respectively;

$\rho_1$, $\rho_2$: specific gravities (g/cm³) of the subsidiary heating means and semiconductor wafer, respectively;

$d_1$, $d_2$: thicknesses (cm) of the subsidiary heating means and semiconductor wafer, respectively; and $C_1$, $C_2$: specific heats (joule/g.°C.) of the subsidiary heating means and semiconductor wafer, respectively.

The heating method of this invention is effective in improving the uniformity of the temperature distribution on a wafer surface, thereby successfully preventing the occurrence of such large "warping" as to impair subsequent treatment and/or processing steps and such a damage as "slip line". Therefore, the present invention is extremely valuable from the practical viewpoint.

The above and other objects, features and advantages of the present invention will become apparent from the following description and the appended claims, taken in conjunction with the accompanying drawings.

DETAILED DESCRIPTION OF THE INVENTION

Figure 1:
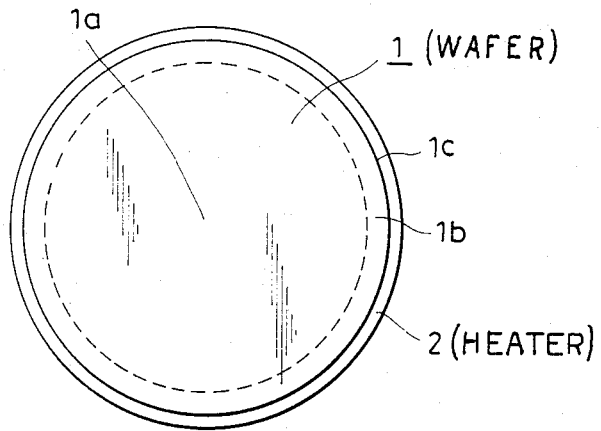
FIG. 1 is a top plan view of a wafer and subsidiary heating means in a state that the wafer is heat-treated in accordance with one embodiment of this invention.

Referring now to the drawings, preferred embodiments of this invention will be described.

Figure 2:
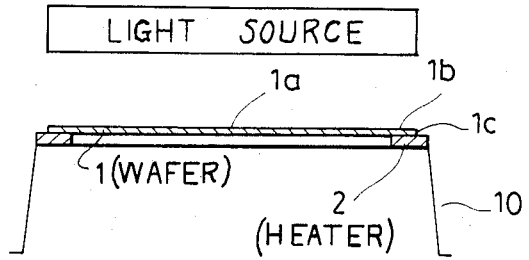
FIG. 2 is a cross-sectional front view of the wafer and subsidiary heating means.

Reference is first made to FIG. 1 and FIG. 2. Although not shown in the drawings, twelve (12) tubular halogen lamps, each of the power consumption of 700 W, are arranged close to one another in a plane over and parallel to the upper surface of the semiconductor wafer 1 to be heat-treated thereby forming a plane light source, and another plane light source of the same arrangement of the lamps also provided underneath and parallel to the lower surface of the wafer 1 so that the wafer can be heated with the same uniform radiant energy density at both upper and lower surfaces thereof to about 1100° C. at central portions 1a of the upper and lower surfaces. In this embodiment, the above plane light sources consume in total about 17 KW of electric power for radiation of light. The wafer 1 may for example be a disk made of a single crystal of silicon doped with boron in accordance with the ion implantation process and has a diameter of 4 inches, thickness $d_2$ of 0.04 cm, reflectively $\eta_2$ of 0.3 to light of 10,000 Å wavelength, specific gravity $\rho_2$ of 2.33 (g/cm³) and specific heat $C_2$ of 0.95 (joule/g.°C.). The characteristic value $\beta$ of this wafer 1 is about 7.9 (cm².°C./joule), in which $\beta$ is expressed by the following formula:

$$\beta = \frac{1 - \eta_2}{\rho_2 \cdot d_2 \cdot C_2}$$

Numeral 2 indicates a ring having a thickness $d_1$ of 0.025 cm, inner diameter of 97 mm, outer diameter of 127 mm, reflectivity $\eta_1$ of 0.5 to light of 10,000 Å wavelength, specific gravity $\mu_1$ of 10.2 (g/cm³) and specific heat $C_1$ of 0.28 (joule/g.°C.). The ring is made of a molybdenum plate and applied with an $SiO_2$ coating on the surface thereof and serves as the subsidiary heating means. The subsidiary heating means 2 is arranged on the upper or lower surface of the wafer 1 so that the subsidiary heating means 2 is kept in contact with a circumferential edge 1c of the wafer 1 or a surface portion 1b of the wafer 1, said surface portion 1b lying in the vicinity of the circumferential edge 1c. When arranging the subsidiary heating means 2 for example on the lower surface of the wafer 1, the wafer 1 may be mounted directly on the subsidiary heating means 2. Numeral 10 denotes supporting legs of the subsidiary heating means 2. The characteristic value ($\alpha$) of the subsidiary heating means is about 7.0 (cm².°C./joule), in which $\alpha$ is expressed by the following formula:

$$\alpha = \frac{1 - \eta_1}{\rho_1 \cdot d_1 \cdot C_1}$$

Thus, the ratio $\alpha/\beta$ is about 0.89.

Then, the wafer 1 and subsidiary heating means 2 are exposed to light radiated from the aforementioned plane light sources. The heating of the wafer is generally carried out in an inert gas.

According to the above heating method, the wafer 1 is primarily heated at both upper and lower surfaces thereof as the upper and lower surfaces of the wafer 1 are exposed to light radiated from the upper and lower plane light sources. Since the subsidiary heating means 2 which is made of a high fusing point metal and may be heated upon exposure to the radiated light is arranged in contact with the surface of the circumferential edge 1c of the wafer 1 or the surface portion 1b lying in the vicinity of the circumferential edge 1c, the temperature of the subsidiary heating means rises upon exposure to light radiated from its corresponding plane light source. Furthermore, the ratio ($\alpha/\beta$) of the characteristic value ($\alpha$) of the subsidiary heating means 2 to that ($\beta$) of the wafer 1 falls within the range of from 0.7 to 1.3 the significance of which range will be described herein. Accordingly, the temperature-rising velocity of the wafer has substantially been coincided with that of the subsidiary heating means 2. As a result, the portion 1b of the wafer 1 is additionally heated with high efficiency and the temperature difference between the central portion 1a and the surface portion 1b lying in the vicinity of the circumferential edge 1c of the wafer 1 is rendered extremely small, thereby making the temperature uniform throughout the wafer 1. Consequently, it is possible to avoid the occurrence of such large "warping" as to impair subsequent treatment and/or processing steps and the development of "slip line".

When the semiconductor wafer 1 is heated by means of application of light radiated from the plane light sources in the above arrangement, the central portion 1a of the wafer 1 is heated to about 1100° C. whereas the surface portion 1b lying in the vicinity of the circumferential edge 1c of the wafer 1 reaches about 1070° C. Although the surface portion 1b is still slightly lower in temperature than the central portion 1a, the wafer 1 does not develop such large "warping" as impairing subsequent treatment and/or processing steps and is also free of "slip line". Thus, the wafer 1 can be successfully subjected to the heat treatment. For the sake of comparison, a wafer similar to the wafer 1 was heat-treated in the same manner as in the above embodiment except that the additional heating by means of the subsidiary heating means 2 was not effected. The temperature of the surface portion 1b lying in the vicinity of the circumferential edge 1c of the wafer 1 remained rather cool, namely, reached about 1010° C. only and the wafer 1 developed such large "warping" as to impair subsequent treatment and/or processing steps, and the occurrence of "slip line" was observed in the circumference of the wafer 1.

As mentioned above, the heating by means of application of radiated light features a temperature increase in a short time period. Accordingly, the subsidiary heating means must be heated in exactly or substantially the same manner as the wafer in a short time period when heated by means of application of radiated light. This is very important because, if the temperature-rising velocity of the subsidiary heating means should be significantly slower than the temperature-rising velocity of the wafer, the subsidiary heating means cannot exhibit enough additional-heating effect and is unable to raise the temperature of the surface portion of the wafer, which portion lies in the vicinity of the circumferential edge of the wafer, to any significant extent. Where the temperature-rising velocity of the subsidiary heating means is considerably faster than the temperature-rising velocity of the wafer in contrast to the above situation, the wafer becomes too hot at the surface portion lying in the vicinity of its circumferential edge. It is difficult to achieve the object of this invention in each of the above situations.

The temperature-rising velocity $(\Delta T)/(\Delta t)$ of a material may be expressed, whether the material is a wafer or a subsidiary heating means, by the following equation:

$$\rho \cdot d \cdot S \cdot C \cdot \frac{\Delta T}{\Delta t} = \phi \cdot (1 - \eta) \cdot S - x$$

where
- $\phi$: energy density of light irradiated onto a surface perpendicular to the direction of the radiated light (W/cm$^2$);
- $S$: area of the surface (cm$^2$);
- $d$: thickness (cm);
- $\rho$: specific gravity (g/cm$^3$);
- $C$: specific heat (joule/g.°C.);
- $\eta$: reflectivity
- $x$: heat loss due to radiation, conduction, convection, etc.

Since the value $x$ is small compared with the first variable $\phi$, the above equation may be rewritten approximately as:

$$\rho \cdot d \cdot S \cdot C \cdot \frac{\Delta T}{\Delta t} \approx \phi \cdot (1 - \eta) \cdot S, \text{ namely,}$$

$$\frac{\Delta T}{\Delta t} \approx \phi \cdot \frac{1 - \eta}{\rho \cdot d \cdot C}$$

Thus, using $$\frac{1 - \eta}{\rho \cdot d \cdot C}$$

as a designing standard for the subsidiary heating means, it is preferred to make the characteristic value $$\alpha = \frac{1 - \eta_1}{\rho_1 \cdot d_1 \cdot C_1}$$

of the subsidiary heating means substantially equal to the characteristic value $$\beta = \frac{1 - \eta_2}{\rho_2 \cdot d_2 \cdot C_2}$$

of the wafer. It has however been found through a great deal of experimentation that desired additional heating effect can be obtained if the ratio $\alpha/\beta$ falls actually within the range of from 0.7 to 1.3. If this ratio $\alpha/\beta$ should be lower than 0.7, the resulting additional heating effect is too small and the temperature of the surface portion lying in the vicinity of the circumferential edge of the wafer does not rise too much and still remains considerably lower than the temperature of the central portion of the wafer, thereby developing such large "warping" as to impair subsequent treatment and/or processing steps and causing the occurrence of "slip line". If the ratio $\alpha/\beta$ should exceed 1.3 on the other hand, the temperature of the surface portion lying in the vicinity of the circumferential edge of the wafer becomes significantly higher than the temperature of the central portion of the wafer in contrast to the above situation, thereby causing the development of large "warping" and "slip line" similar to the above situation.

As reflectivities, $\eta_1$ and $\eta_2$ are employed those for light having a wavelength of 10,000 Å.

The temperature-rising velocity of the subsidiary heating means remains substantially the same as the wafer similar to the above embodiment and the subsidiary heating means acts effectively so long as the ratio $\alpha/\beta$ is controlled within the range from 0.7 to 1.3, also when a high fusing point metal such as tungsten or tantalum is used in place of molybdenum.

As has been understood from the above embodiment, the present invention is to prevent the occurrence of such large "warping" as to impair subsequent treatment and/or processing steps and of "slip line" by keeping subsidiary heating means in contact with the circumferential edge 1c of the wafer or the surface portion 1b lying in the vicinity of the circumferential edge 1c of the wafer to additionally heat principally the surface portion 1b of the wafer so that the temperature difference between the central portion 1a and the surface portion 1b is minimized and the surface temperature of the wafer is kept completely uniform.

Figure 3:
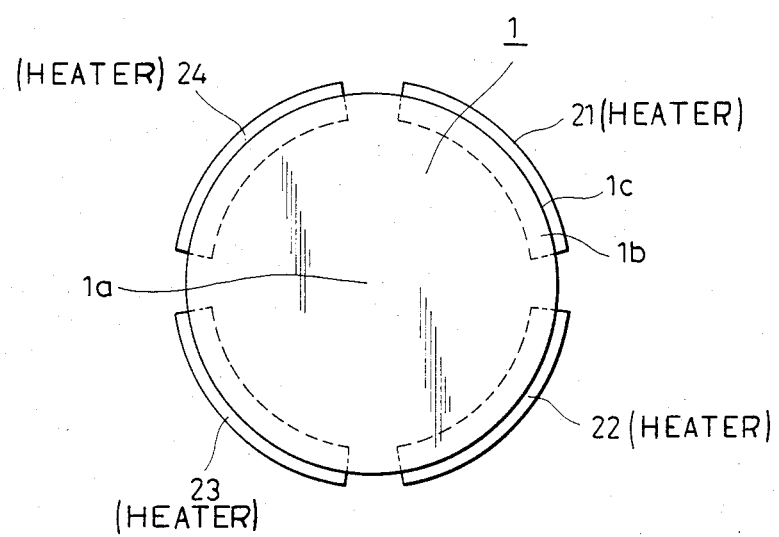
FIG. 3 is a top plan view of a wafer and subsidiary heating means similar to those of FIG. 1 but arranged in accordance with another embodiment of the present invention.

A specific embodiment of the method according to this invention has been described above. The present invention is however not limited by or to the above embodiment and various modifications and changes may be made thereto. For example, the subsidiary heating means 2 may be provided, as shown in FIG. 3, in a form divided into a plurality of subsidiary heating means, for example, four subsidiary heating means 21, 22, 23, 24 and may be arranged symmetrically in contact with the surface of the circumferential edge 1c of the wafer or the surface portion 1b lying in the vicinity of the circumferential edge 1c of the wafer. Where a plane light source is arranged only above or below the wafer 1, it is preferred to provide the subsidiary heating means 2 on the surface opposite to that facing the plane light source because the subsidiary heating means 2 does not interfere light radiated from the plane light source onto the wafer 1. It is feasible to support the wafer 1 and subsidiary heating means 2 respectively by separate support means.

Having now fully described the invention, it will be apparent to one of ordinary skill in the art that many changes and modifications can be made thereto without departing from the spirit or scope of the invention as set forth herein.

What is claimed is:

1. A method for heating a semiconductor wafer by means of application of light radiated from a light source while additionally heating a circumferential portion of the semiconductor wafer by subsidiary heating means which per se is heated upon exposure to the radiated light and is arranged in contact with one of a surface of a circumferential edge and a surface portion lying in the vicinity of the circumferential edge of the semiconductor wafer, which method comprises limiting a ratio $(\alpha/\beta)$ of a characteristic value $(\alpha)$ of the subsidiary heating means to that ($\beta$) of the semiconductor wafer to from 0.7 to 1.3, said $\alpha$ and $\beta$ being expressed respectively by the following formulae:

$$\alpha = \frac{1 - \eta_1}{\rho_1 \cdot d_1 \cdot C_1}$$

$$\beta = \frac{1 - \eta_2}{\rho_2 \cdot d_2 \cdot C_2}$$

where $\eta_1$, $\eta_2$: reflectivities of the subsidiary heating means and semiconductor wafer, respectively;

$\rho_1$, $\rho_2$: specific gravities (g/cm$^3$) of the subsidiary heating means and semiconductor wafer, respectively;

$d_1$, $d_2$: thicknesses (cm) of the subsidiary heating means and semiconductor wafer, respectively; and $C_1$, $C_2$: specific heats (joule/g.°C.) of the subsidiary heating means and semiconductor wafer, respectively.

2. A method as claimed in claim 1, wherein the subsidiary heating means is a ring made of high fusing point metal.

3. A method as claimed in claim 1, wherein the semiconductor wafer has been pretreated by ion implantation process.

4. A method as claimed in claim 2, wherein said metal is a metal selected from the group consisting of molybdenum, tungsten, and tantalum.

* * * * *